United States Patent
Lee et al.

(10) Patent No.: US 9,608,204 B2
(45) Date of Patent: Mar. 28, 2017

(54) RESISTIVE RANDOM ACCESS MEMORY AND MANUFACTURING METHOD THEREOF

(71) Applicant: TAIWAN SEMICONDUCTOR MANUFACTURING COMPANY LTD., Hsinchu (TW)

(72) Inventors: Po-Hao Lee, Hsinchu (TW); Chung-Cheng Chou, Hsin-Chu (TW); Wen-Ting Chu, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/021,364

(22) Filed: Sep. 9, 2013

(65) Prior Publication Data

US 2015/0069316 A1    Mar. 12, 2015

(51) Int. Cl.
*H01L 45/00* (2006.01)

(52) U.S. Cl.
CPC .......... *H01L 45/1683* (2013.01); *H01L 45/08* (2013.01); *H01L 45/124* (2013.01); *H01L 45/1273* (2013.01); *H01L 45/146* (2013.01)

(58) Field of Classification Search
CPC .. H01L 45/1253; H01L 45/1683; H01L 45/08
See application file for complete search history.

(56) References Cited

U.S. PATENT DOCUMENTS

| | | | |
|---|---|---|---|
| 2005/0191804 A1* | 9/2005 | Lai et al. ................. | 438/238 |
| 2006/0006471 A1* | 1/2006 | Rossel .................... | H01L 27/20 |
| | | | 257/358 |

(Continued)

FOREIGN PATENT DOCUMENTS

| | | |
|---|---|---|
| CN | 1813360 A | 8/2006 |
| CN | 103117359 A | 5/2013 |

(Continued)

OTHER PUBLICATIONS

Notice of Allowance issued by Korea Intellectual Property Office for corresponding KIPO application 10-2013-0154140 dated Feb. 23, 2015.
English translation of the Notice of Allowance issued by Korea Intellectual Property Office for corresponding KIPO application 10-2013-0154140 dated Feb. 23, 2015.
English translation of 2006-032728.
US20130112936 serves as the English translation of WO2012098879 as it is the corresponding US application.
US20090179188 serves as the English translation of JP2009-505424 as it is the corresponding US application.

(Continued)

*Primary Examiner* — Matthew Reames
(74) *Attorney, Agent, or Firm* — WPAT, P.C., Intellectual Property Attorneys; Anthony King; Kay Yang

(57) ABSTRACT

The present disclosure provides a semiconductor structure which includes a conductive layer and a resistance configurable structure over the conductive layer. The resistance configurable structure includes a first electrode, a resistance configurable layer over the first electrode, and a second electrode over the resistance configurable layer. The first electrode has a first sidewall, a second sidewall, and a bottom surface on the conductive layer. A joint between the first sidewall and the second sidewall includes an electric field enhancement structure. The present disclosure also provides a method for manufacturing the above semiconductor structure, including patterning a hard mask on a conductive layer; forming a spacer around the hard mask; removing at least a portion of the hard mask; forming a conforming resistance configurable layer on the spacer; and forming a second conductive layer on the conforming resistance configurable layer.

20 Claims, 9 Drawing Sheets

(56) References Cited

U.S. PATENT DOCUMENTS

| | | |
|---|---|---|
| 2006/0097238 A1 | 5/2006 | Breuil et al. |
| 2008/0012079 A1 | 1/2008 | Zaidi |
| 2009/0179188 A1 | 7/2009 | Liu |
| 2011/0215436 A1* | 9/2011 | Tang .................... H01L 29/861 257/506 |
| 2013/0112936 A1 | 5/2013 | Wei et al. |

FOREIGN PATENT DOCUMENTS

| | | |
|---|---|---|
| JP | 2006-032728 | 2/2006 |
| JP | 2009-505424 | 2/2009 |
| JP | 5270046 | 8/2013 |
| WO | 2012098879 | 7/2012 |

OTHER PUBLICATIONS

Office action and english translation of Korea Intellectual Property Office for corresponding KIPO appliccation 10-2013-0154140 dated Nov. 28, 2014.
US20130112936 serves as the English translation of JP5270046 as it is the corresponding US application.
Office Action issued by China State Intellectual Property Office for corresponding China application 201410340990.3 dated Jul. 25, 2016.
Office Action issued by China State Intellectual Property Office for corresponding China application 201410340990.3 dated Feb. 4, 2017.
CN1813360A corresponds to US20060097238.

* cited by examiner

RESISTIVE RANDOM ACCESS MEMORY AND MANUFACTURING METHOD THEREOF

FIELD

The present disclosure relates to a resistive random access memory.

BACKGROUND

A semiconductor memory array includes a plurality of unit memory cells that are electrically connected to one another. In dynamic random access memory (DRAM), for example, a unit memory cell may include one switch and one capacitor. A DRAM has high integration density and high operation speed. However, when power is not supplied to the DRAM, data stored in the DRAM is erased. An example of non-volatile memory is flash memory, in which stored data is not erased when power is not supplied. Although flash memory has non-volatile characteristics, flash memory has low integration density and low operation speed as compared to DRAM.

Resistive random access memory (RRAM) is one of the non-volatile memory devices. An RRAM is a resistive type memory based on a characteristic that a resistance of a transition metal oxide varies according to a voltage applied thereto, and the resistance is used to store a bit of data in an RRAM cell instead of an electronic charge used in the DRAM. An RRAM consists of a metal-insulator-metal (MIM) structure in which the insulating materials show a resistive switching behavior.

Conductive paths or so-called conductive filaments (CF) are formed in such insulating materials after an electroforming step. After the generation of the CF, when passing a current through the capacitor like structure, a low resistance state (LRS) is identified, indicating a digital signal "0" or "1". The RRAM can then be RESET by receiving a voltage high enough to break the CF in the insulating materials, wherein a high resistance state (HRS) is identified, indicating a digital signal "1" or "0". The two states (LRS, HRS) of the RRAM are reversible based on a voltage applied thereto.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale.

In fact, the dimensions of the various features may be arbitrarily increased or reduced for clarity of discussion.

DETAILED DESCRIPTION OF THE INVENTION

Figure 1:
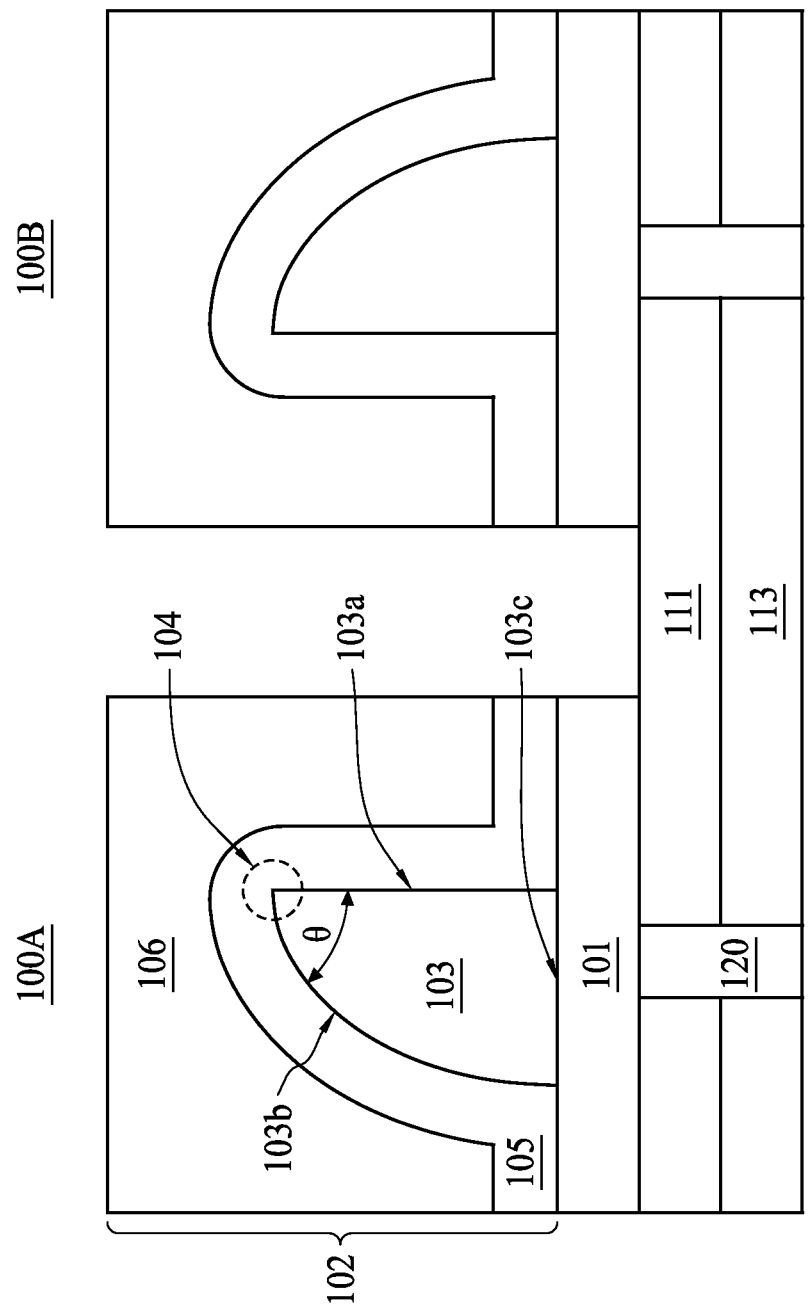
FIG. 1 is a cross sectional view of two memory storing structures in an RRAM cell according to some embodiments of the present disclosure.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

The formation and the rupture of conductive filaments (CF) are attributed to be related to the defects, for example oxygen vacancies, in the insulating layer in the RRAM. The nature of the conduction mechanism of the above mobile defect specie is not clearly understood and hence the specific positions where the CF are generated in the insulating layer are not controllable. In some examples where two conductive electrodes are both in planar shape and arranged in parallel, the electric field distribution in the insulating layer in between the electrodes is uniform, and hence the CF are formed randomly under a uniform electric field setting.

Some embodiments in the present disclosure provide an electrode having an electric field enhancement structure which includes, but not limited to, a convex, a sharp bent, or a peak. The electric field enhancement structure is configured to enhance the electric field intensity at a specific position. Since the CF are prone to be formed at said specific position, the location and the density of the CF can be predicted or controlled.

Because of processing variations, sharp features such as sharp concave or sharp convex structures on either the surface or the bottom of the insulating layer effectively create a high electric field. The CF are typically easier to form at certain positions with enhanced electric field than other regions without such sharp features. Surface morphologies of the sharp features normally include parabolas with small radius of curvature, sharp bent, or a cusp.

In operating an RRAM, a low forming voltage is desired for practical applications. Forming voltage is dependent on a thickness of the insulating layer. To prevent permanent dielectric breakdown, high-k dielectric materials such as $HfO_x$ (with a dielectric constant of 30) and $ZrO_x$ (with a dielectric constant of 25) are normally used. Some embodiments in the present disclosure provide an MIM structure in RRAM that effectively decrease the forming voltage not only by reducing the thickness of the insulating layer but also by forming an electric field enhancement structure. In some embodiments, the geometric character of the electric field enhancement structure includes, but not limited to, a convex, a sharp bent, or a peak. The electric field enhancement structure is comparatively easy to generate a point-discharge by intensifying local electric field.

DEFINITIONS

In describing and claiming the present disclosure, the following terminology will be used in accordance with the definitions set forth below.

As used herein, a "substrate" refers to a bulk substrate on which various layers and device structure are formed. In some embodiments, the bulk substrate includes silicon or a compound semiconductor, such as GaAs, InP, Si/Ge, or SiC. Examples of the layers include dielectric layers, doped layers, polysilicon layers or conductive layers. Examples of the device structures include transistors, resistors, and/or capacitors, which may be interconnected through an interconnect layer to additional integrated circuits.

As used herein, "deposition" refers to operations of depositing materials on a substrate using a vapor phase of a material to be deposited, a precursor of the material, an electrochemical reaction, or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using electrochemical reaction include electroplating, electro-less plating, and the like. Other examples of deposition include pulse laser deposition (PLD), and atomic layer deposition (ALD).

As used herein, "metal oxide" refers to binary metal oxides, transition metal oxides, and lanthanide series metal oxides. The metal oxides described herein are often nonsoichiometric, thus a subscript "x" for the oxygen composition is used in the present disclosure. The metal oxide includes $MgO_x$, $AlO_x$, $TiO_x$, $CrO_x$, $MnO_x$, $FeO_x$, $CoO_x$, $NiO_x$, $CuO_x$, $ZnO_x$, $GeO_x$, $YO_x$, $ZrO_x$, $NbO_x$, $MoO_x$, $SnO_x$, $LaO_x$, $HfO_x$, $TaO_x$, $WO_x$, $CeO_x$, $GdOx$, $YbO_x$, and $LuO_x$.

As used herein, a "mask layer" recited in the present disclosure is an object of a patterning operation. The patterning operation includes various steps and operations and varies in accordance with features of embodiments. In some embodiments, a patterning operation patterns an existing film or layer. The patterning operation includes forming a mask on the existing film or layer and removing the unmasked portion of the film or layer with an etch or other removal operation. The mask layer is a photo resist or a hardmask. In some embodiments, a patterning operation directly forms a patterned layer on a surface. The patterning operation includes forming a photosensitive film on the surface, conducting a photolithography operation and a developing operation. The remaining photosensitive film may be removed or retained and integrated into the package.

As used herein, a "metal-insulator-metal (MIM)" structure recited in the present disclosure refers to a capacitor-like structure with two low resistance layers sandwiching a high resistance layer. In some embodiments, the low resistance layers are metal or other non-metal such as polysilicon having a resistance lower than the resistance of the layer being sandwiched. In some embodiments, the high resistance layer is dielectric materials including binary metal oxides. In certain embodiments, the MIM structure is not limited to a planar stack. At least two metal-insulator interfaces are created in an MIM structure. In certain embodiments of the present disclosure, the contour of the interface includes at least one of a straight line, an arc, a sharp bent, or the like.

As used herein, a "spacer" recited in the present disclosure refers to structures surrounding a protrusion positioned on a surface and contacting the sidewall of said protrusion. The spacer is used to seclude the protrusion from the adjacent elements on the surface. In some embodiments of the present disclosure, the protrusion is partially removed, leaving the spacer and the thinned protrusion on the surface. In other embodiments of the present disclosure, the protrusion is completely removed, leaving only the spacer on the surface. The spacer recited in the present disclosure is composed of insulating materials such as oxides, polymer, ceramics, or conductive materials such as Pt, AlCu, TiN, Au, Ti, Ta, TaN, W, WN, Cu, and the combinations thereof.

As used herein, a "resistance configurable layer" recited in the present disclosure refers to an insulating layer having a variable resistance when subjecting to different voltages. The insulating layer demonstrates a switching behavior between a high resistance state (HRS) and a low resistance state (LRS) after a forming operation. The switching between the HRS and LRS is controlled by a RESET and a SET voltage, respectively. In some embodiments, the resistance configurable layer is composed of dielectric materials having a high-k dielectric constant, binary metal oxides, transition metal oxides, or lanthanide series metal oxides. In certain embodiments, the resistance configurable layer includes nickel oxide, titanium oxide, hafnium oxide, zirconium oxide, zinc oxide, tungsten oxide, aluminum oxide, tantalum oxide, molybdenum oxide or copper oxide.

As used herein, a "RESET" voltage recited in the present disclosure refers to a voltage high enough to disconnect the conductive filament in a resistance configurable layer is applied to the electrodes sandwiching the resistance configurable layer. The resistance configurable layer demonstrates an OFF or a HRS under the application of a RESET voltage.

As used herein, a "SET" voltage recited in the present disclosure refers to a voltage high enough to reconnect the conductive filament in a resistance configurable layer is applied to the electrodes sandwiching the resistance configurable layer. The resistance configurable layer demonstrates an ON or a LRS under the application of a SET voltage Referring to FIG. 1, a cross sectional view of two bits, or two memory storing structure 100A and 100B in an RRAM cell is depicted. In some embodiments, structures of the two adjacent bits are identical, and hence the following description is directed to the memory storing structure 100A. A conductive layer 101 is positioned over a conductive structure 120 and a stack of dielectric layers (111, 113). A resistance configurable structure 102 is disposed on the conductive layer 101. The resistance configurable structure 102 is composed of a metal-insulator-metal (MIM) structure, in which a major portion of a resistance configurable layer 105 is essentially sandwiched between a first electrode 103 and a second electrode 106, and a minor portion of the resistance configurable layer 105 is essentially sandwiched between the conductive layer 101 and the second electrode 106.

The first electrode 103 includes asymmetric sidewalls. In some embodiments, the first electrode 103 includes a first sidewall 103a and a second sidewall 103b. A joint where the first sidewall 103a and the second sidewall 103b meet includes a sharp bent, or an electric field enhancement structure 104. The electric field enhancement structure 104 has an angle θ about or less than 90 degrees. In some embodiments, the first electrode 103 has a step-like feature (not shown), and hence the angel θ is about 90 degrees. In some embodiments, the first electrode 103 has a sidewall spacer structure as shown in FIG. 1, the resulting angle θ is less than 90 degrees.

In some embodiments, the resistance configurable layer 105 is at least one of dielectric materials having a high-k dielectric constant, binary metal oxides, transition metal oxides, and lanthanide series metal oxides. In some embodiments, the resistance configurable layer 105 includes nickel oxide, titanium oxide, hafnium oxide, zirconium oxide, zinc oxide, tungsten oxide, aluminum oxide, tantalum oxide, molybdenum oxide or copper oxide.

A bottom surface 103c of the first electrode 103 connects the first sidewall 103a and the second sidewall 103b. The bottom surface 103c is positioned on the conductive layer 101. A portion of the resistance configurable layer 105 is disposed on the conductive layer 101. In some embodiments, when comparing to dielectric layer 111, dielectric layer 113 possesses a lower etching resistance. In certain embodiments, dielectric layer 111 is an etch stop including at least one of silicon carbide, silicon oxynitride, and silicon nitride.

In some embodiments, dielectric layer 111 and 113 are composed of materials with a similar etching resistance. For example, dielectric layer 111 and 113 are silicon oxide, fluorinated silica glass (FSG), carbon doped silicon oxide, silicon nitride, silicon oxynitride, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric materials, or combination thereof.

Referring to FIG. 1, the conductive layer 101 and the first electrode 103 are made of same conductive material. In some embodiments, the conductive layer 101 and the first electrode 103 are made of at least one of the following: Pt, AlCu, TiN, Au, Ti, Ta, TaN, W, WN, Cu or combinations thereof. In some embodiments, the conductive layer 101 and the first electrode 103 are made of different materials selected from the group recited in the present paragraph. In certain embodiments, the first electrode 103 and the second electrode 106 are composed of same materials selected from the group recited in the present paragraph. In other embodiments, the first electrode 103 and the second electrode 106 are composed of different materials selected from the group recited in the present paragraph.

In some embodiments, the conductive structure 120 shown in FIG. 1 under the resistance configurable structure 102 and the conductive layer 101 is a conductive plug electrically connecting the first electrode to a drain of a transistor (not shown). The conductive structure 120 includes copper, copper alloys, aluminum, or tungsten. The second electrode 106 is further connected to a bit line of an RRAM (not shown). The CF are generated in the resistance configurable layer 105 when the electric potential difference across the resistance configurable layer 105 reaches forming voltage.

Figure 2:
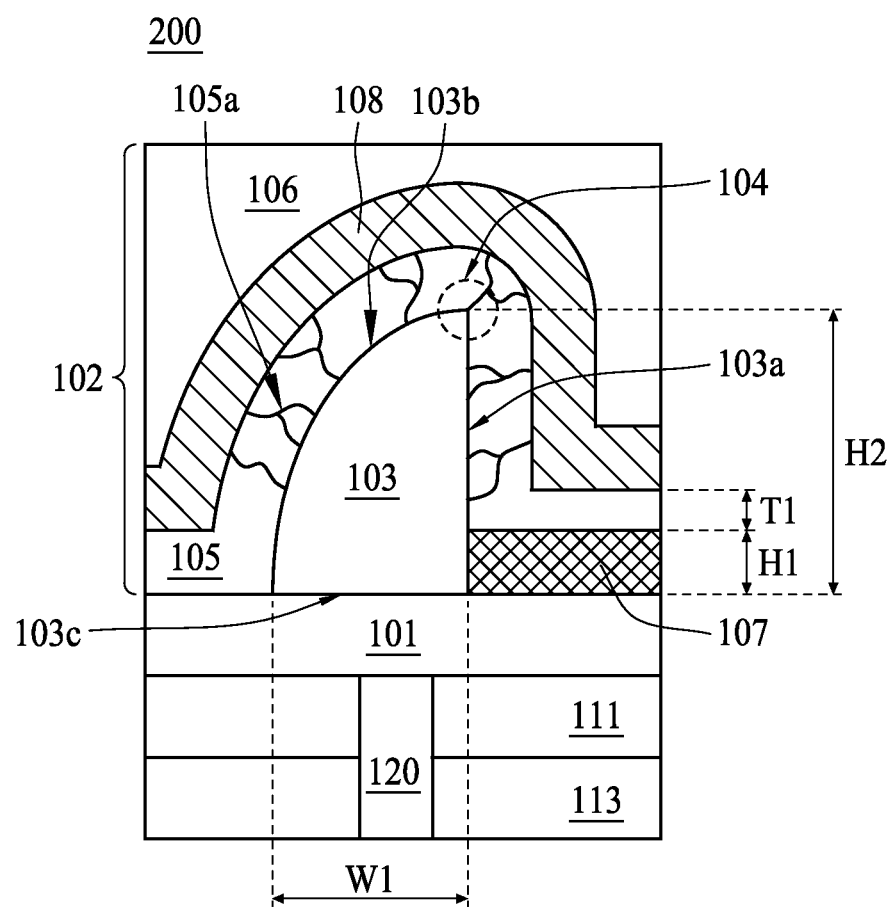
FIG. 2 is a cross sectional view of a memory storing structures in an RRAM cell according to some embodiments of the present disclosure.

Referring to FIG. 2, a bit in an RRAM, or a memory storing structure 200 is provided. Elements with same labeling numbers as those in FIG. 1 are previously discussed with reference thereto and are not repeated here for simplicity. In FIG. 2, the resistance configurable structure 102 further includes a dielectric layer 107, positioned on the conductive layer 101 and contacting a portion of the first sidewall 103a of the first electrode 103.

A thickness H1 of the dielectric layer 107 is less than a thickness H2 of the first electrode 103 in order to expose a joint of the first sidewall 103a and the second sidewall 103b. A thickness H1 or a height of the dielectric layer 107 to a thickness H2 or a height of the first electrode 103 is in a range of from about 0.2 to about 1.0. In some embodiments, the thickness H1 is about one half of the thickness H2. In other embodiments, the thickness H1 is less than one third of the thickness H2.

Compared to FIG. 1, the second electrode 106 in FIG. 2 further includes an oxygen depriving layer 108. The oxygen depriving layer 108 is positioned to be in contact with the resistance configurable layer 105. In some embodiments, the oxygen depriving layer 108 includes conductive materials such as Ti, Ta, Hf, or the like, and hence the oxygen depriving layer 108 functions as a part of the second electrode 106.

It is known in the art that certain metal acts as an oxygen reservoir depleting the oxygen atoms from the oxygen-containing layer in contact therewith. Since the resistance configurable layer 105 includes binary metal oxides, transition metal oxides, and lanthanide series metal oxides, oxygen atoms in said oxides are depleted from the resistance configurable layer 105 when brining it in contact with the oxygen depriving layer 108. Consequently the oxygen vacancies being left in the resistance configurable layer 105 is used to assist the formation and the SET operation Referring back to FIG. 2, the bottom surface 103c of the first electrode 103 has a width W1. In some embodiments, the width W1 is from about 1 nm to about 500 nm. In some embodiments, a ratio between the height H2 and the width W1 of the first electrode 103 is in a range of from about 0.01 to about 200.

In FIG. 2, the resistance configurable layer 105 has a thickness T1 that is thin enough to reduce the forming voltage and thick enough to prevent permanent dielectric break down. In some embodiments, the thickness T1 is about or less than 150 angstrom. As can be seen from FIG. 2, the electric potential difference between the first electrode 103 and the second electrode 106 (collectively including the oxygen depriving layer 108) triggers the formation of the conductive filaments (CF) 105a in the resistance configurable layer 105. In some embodiments, the CF 105a are more likely to be generated in the resistance configurable layer 105, between the electric field enhancement structure 104 and the second electrode 106 (collectively including the oxygen depriving layer 108).

Figure 3:
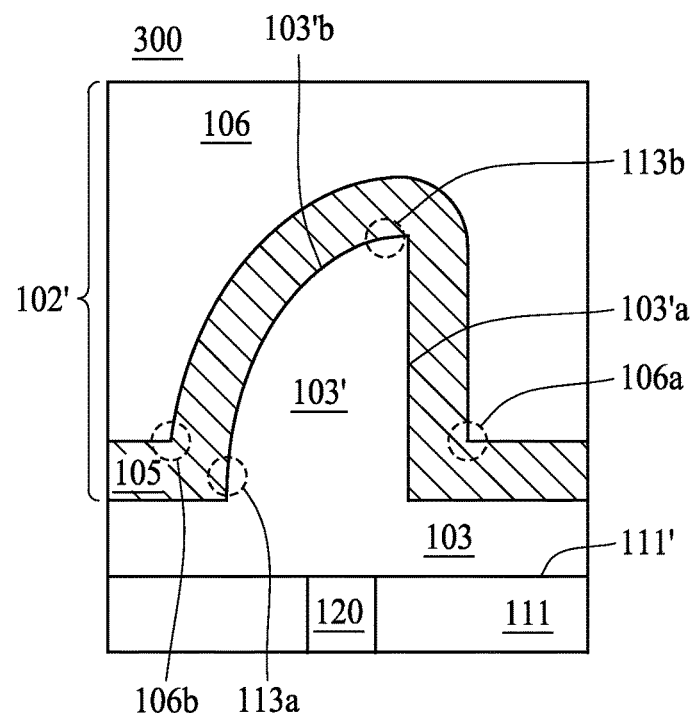
FIG. 3 is a cross sectional view of a memory storing structures in an RRAM cell according to some embodiments of the present disclosure.

Referring to FIG. 3, elements with same labeling numbers as those in FIG. 1 and FIG. 2 are previously discussed with reference thereto and are not repeated here for simplicity. In FIG. 3, a bit in an RRAM, or a memory storing structure 300 is provided. An MIM structure 102' is positioned on a top surface 111' of a first dielectric layer 111. Compared to FIG. 1 and FIG. 2, the MIM structure 102' in FIG. 3 includes a first electrode having a planar portion 103 and an electric field enhancement structure 103'.

In FIG. 3, the electric field enhancement structure 103' has a first sidewall 103'a perpendicular to the top surface 111' of the first dielectric layer 111, a second sidewall 103'b having an arc shape. The arc of the second sidewall 103'b includes a first end 113a and a second end 113b. In some embodiments, the second end 113b of the arc is connected to the first sidewall 103'a. The arc described in the present disclosure does not have to be a perfect geometric construct; any segment which is identified with a radius of curvature less than infinite is considered an arc in the present disclosure.

In certain embodiments, the electric field enhancement structure 103' is a sidewall spacer. Because a sidewall spacer is a functional remainder of a protrusion after an etching operation, the side contacting with the protrusion inherent the geometry of the sidewall of the protrusion. In certain embodiments, the first sidewall 103'a has a vertical feature that is perpendicular to the top surface 111' of the first dielectric layer 111. In other embodiments, the first sidewall 103'a has a tilted or an oblique feature.

As shown in FIG. 3, in addition to the joint between the first sidewall 103'a and the second sidewall 103b, structures (106a, 106b) with abrupt transition in the MIM structure 102' are locations where the electric field intensities are larger than those without such abrupt transitions. In this connection, CF are inclined to be generated at certain locations with higher electric field intensities, and the forming voltage is effectively reduced. In certain embodiments, the electric field enhancement structure is positioned at the first electrode (103, 103'), the second electrode 106, or both.

Figure 4:
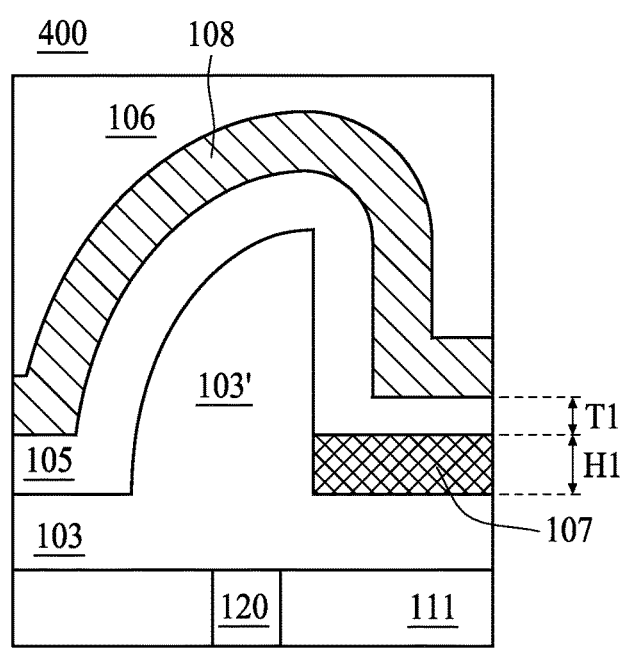
FIG. 4 is a cross sectional view of a memory storing structures in an RRAM cell according to some embodiments of the present disclosure.

Referring to FIG. 4, elements with same labeling numbers as those in FIG. 3 are previously discussed with reference thereto and are not repeated here for simplicity. In FIG. 4, a bit in an RRAM, or a memory storing structure 400 is provided. Compared to FIG. 3, memory storing structure 400 further includes an oxygen depriving layer 108 and a second dielectric layer 107. As can be seen in FIG. 4, the resistance configurable layer 105 is compliant to the morphology of the electric field enhancement structure 103', and the oxygen depriving layer 108 is compliant to the morphology of the resistance configurable layer 105. The morphology conformation preserves the geometric feature of the electric field enhancement structure 103' in the resistance configurable layer 105 and the oxygen depriving layer 108. In certain embodiments, the thickness throughout the resistance configurable layer 105 is uniform.

Figure 5A:
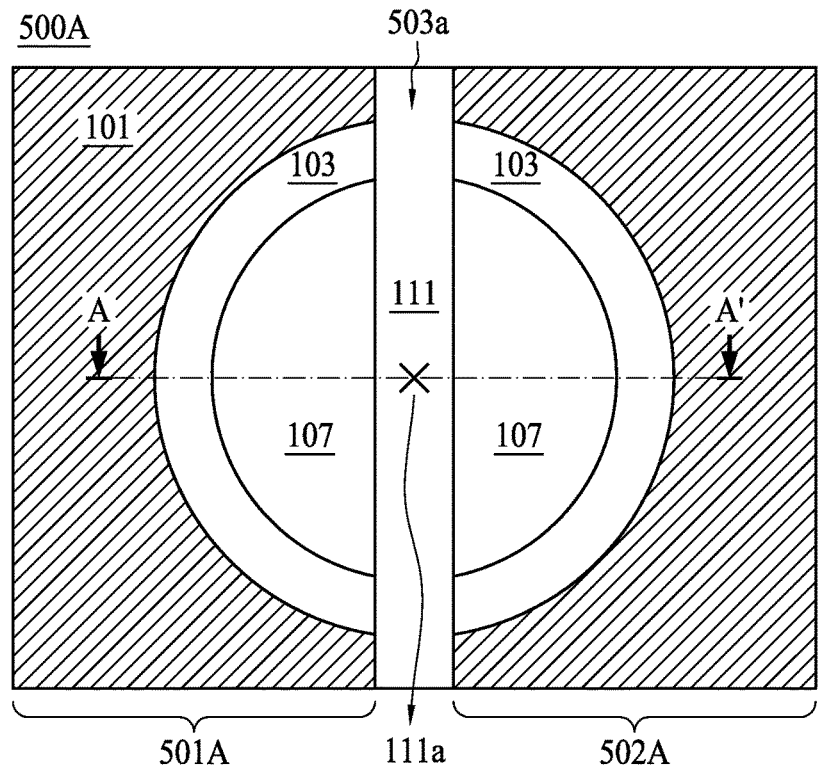
FIG. 5A is a top view of two memory storing structures in an RRAM cell according to some embodiments of the present disclosure.
Figure 5B:
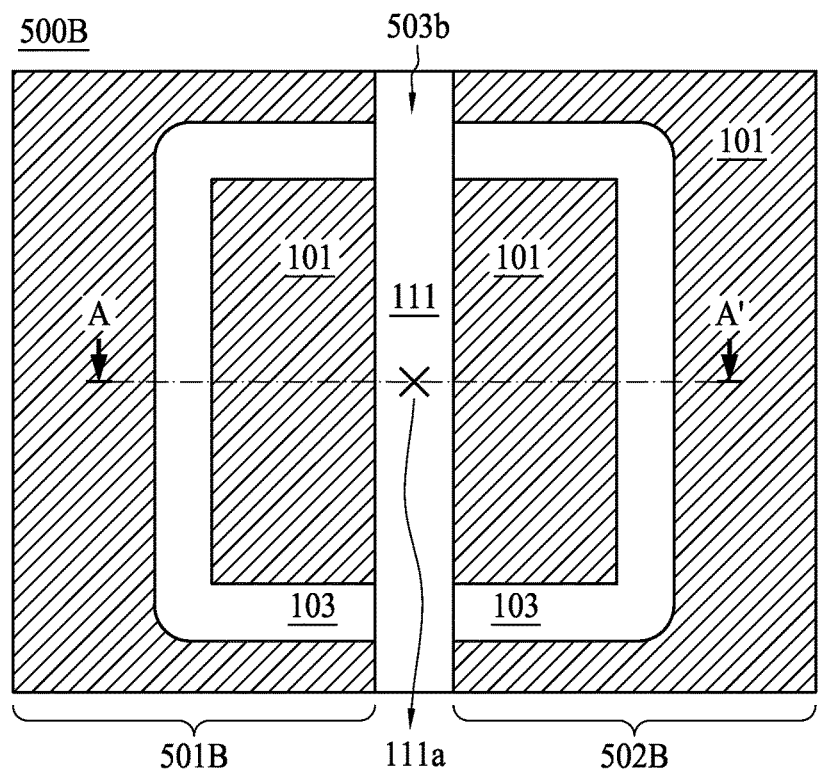
FIG. 5B is a top view of two memory storing structures in an RRAM cell according to some embodiments of the present disclosure.

Referring to FIG. 5A and FIG. 5B, two pairs of memory bits in an RRAM are shown from a top view perspective. In FIG. 5A, memory bits 500A include two memory storing structures 501A and 502A that are electrically isolated by a recessed channel 503a. In some embodiments, the recessed channel 503a exposes the dielectric layer 111 as previously discussed with reference from FIG. 1 to FIG. 4. In certain embodiments, the dielectric layer 111 is an etch stop.

A cross sectional view of the memory bits 500A can be referred to the memory storing structure 100A, 100B in FIG. 1 and the memory storing structure 200 in FIG. 2. Comparing FIG. 2 and FIG. 5A, the memory bits 500A demonstrates a top view after a removal of the second electrode 106, the oxygen depriving layer 108, and the resistance configurable layer 105 shown in FIG. 2 for simplicity. In some embodiments, the two memory storing structures 501A and 502A are symmetric. Each of the memory storing structures 501A and 502A includes a dielectric layer 107 having a semicircular shape, and a first electrode 103 surrounding an arc side of the dielectric layer 107. The dielectric layer 107 and the first electrode 103 are positioned on the conductive layer 101. In some embodiments, the recessed channel 503a passes through a geometric center 111a of the memory bits 500A.

Referring to FIG. 1 and FIG. 5A, the dielectric layers (111, 113) and the conducive structure 120 in FIG. 2 are under the conductive layer 101 in FIG. 5A and hence only a portion of the dielectric layer 111 are shown in FIG. 5A. FIG. 2 is a portion of a cross sectional view along line AA' in FIG. 5A.

In FIG. 5B, memory bits 500B include two memory storing structures 501B and 502B that are electrically isolated by a recessed channel 503b. In some embodiments, the recessed channel 503a exposes the dielectric layer 111 as previously discussed with reference to FIG. 5. In certain embodiments, the dielectric layer 111 is an etch stop.

A cross sectional view of the memory bits 500B can be referred to the memory storing structure 100A in FIG. 1. Comparing FIG. 1 and FIG. 5B, the memory bits 500B demonstrates a top view after a removal of the second electrode 106 and the resistance configurable layer 105 in FIG. 1 for simplicity. In some embodiments, the two memory storing structures 501B and 502B are symmetric. Each of the memory storing structures 501B and 502B includes a first electrode 103 framing a rectangular area on the conductive layer 101. In some embodiments, the recessed channel 503b passes through a geometric center 111a of the memory bits 500B.

Referring to FIG. 1 and FIG. 5B, the dielectric layers (111, 113) and the conducive structure 120 in FIG. 1 are under the conductive layer 101 in FIG. 5B and hence are not shown in FIG. 5B. Memory storing structure 100A in FIG. 1 is a cross sectional view along line AA' in FIG. 5B.

Figure 6:
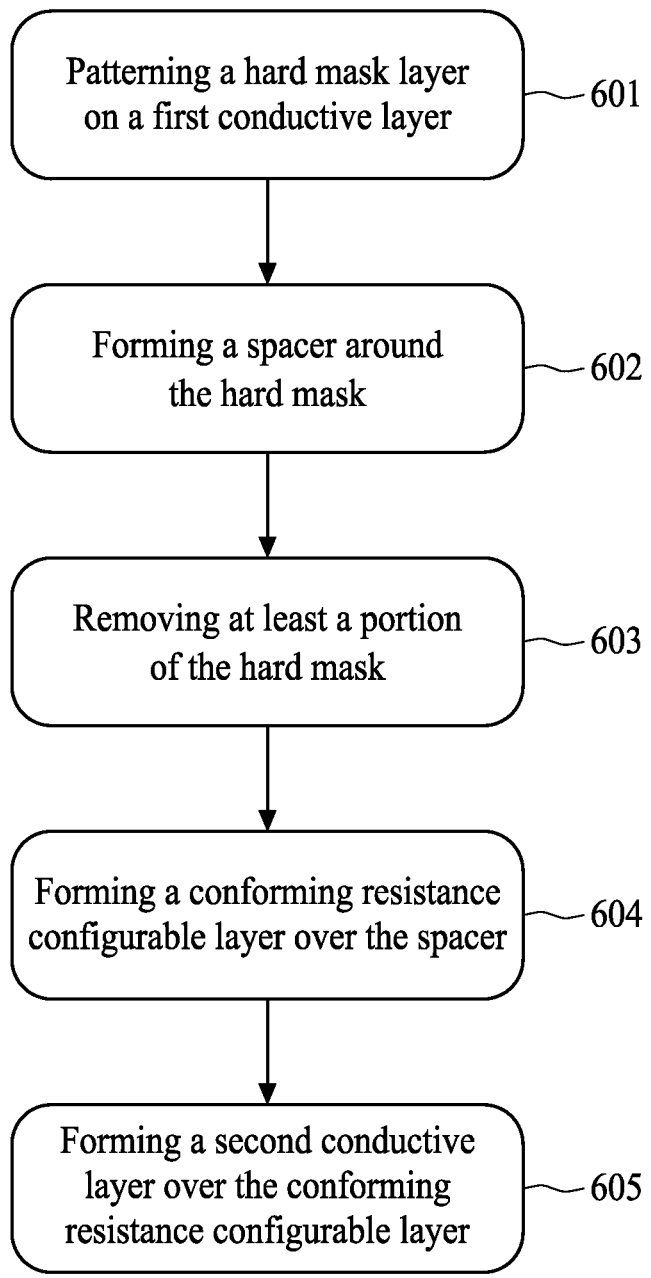
FIG. 6 is a flowchart of method in manufacturing an RRAM according to some embodiments of the present disclosure.

FIG. 6 is a flowchart of method 600 in manufacturing a resistive random access memory (RRAM). FIG. 7A to FIG. 7H are figures corresponding to various operations 601-605 shown in FIG. 6. FIG. 7A to FIG. 7H have been simplified for a better understanding of the inventive concepts of the present disclosure. In FIG. 7A to FIG. 7H, elements with same labeling numbers as those in FIG. 1 to FIG. 4 are previously discussed with reference thereto and are not repeated here for simplicity.

Figure 7A:
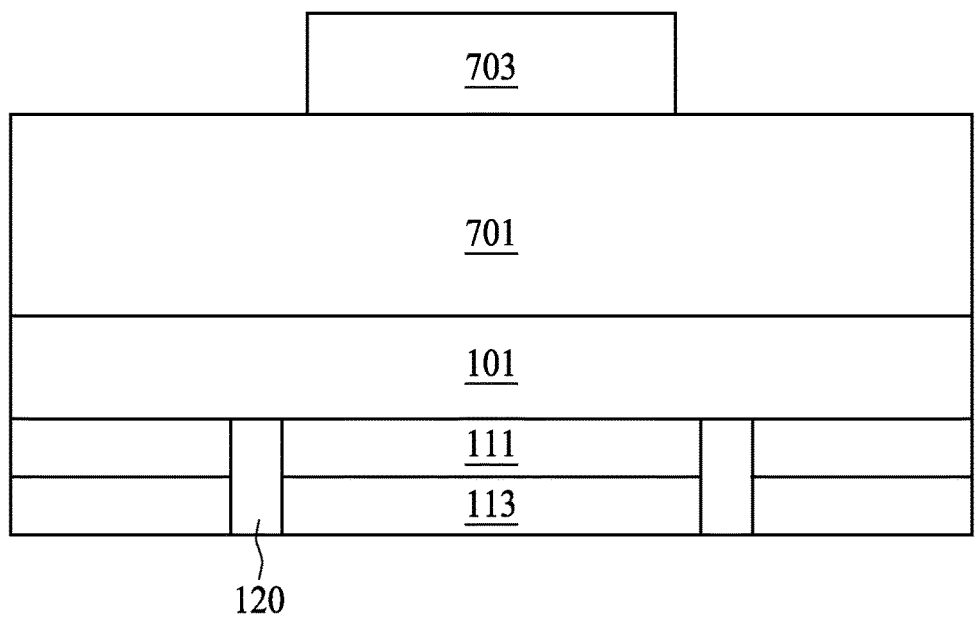
FIG. 7A to FIG. 7H are cross sectional views corresponding to various operations 601 to 605 in FIG. 6.

Operation 601 is to pattern a hard mask layer on a first conductive layer. Referring to FIG. 7A, the first conductive layer 101 is deposited on the dielectric stack (111, 113) and the conductive structure 120. A dielectric layer is blanket formed on the first conductive layer 101. In some embodiments, the dielectric layer is a layer 701 including materials such as nitrides or oxides. The layer 701 patterned by a pattern-bearing mask layer 703 such as a photoresist layer. In FIG. 7A, the pattern-bearing mask layer 703 transforms the pattern into the layer 701 through an etching operation and resulting in a hard mask 701' shown in FIG. 7B. In certain embodiments, the hard mask 701' includes silicon dioxide. From a top view perspective, the hard mask 701' in some embodiments includes a circular shape, a square shape, an oval shape, and a triangular shape.

Figure 7B:
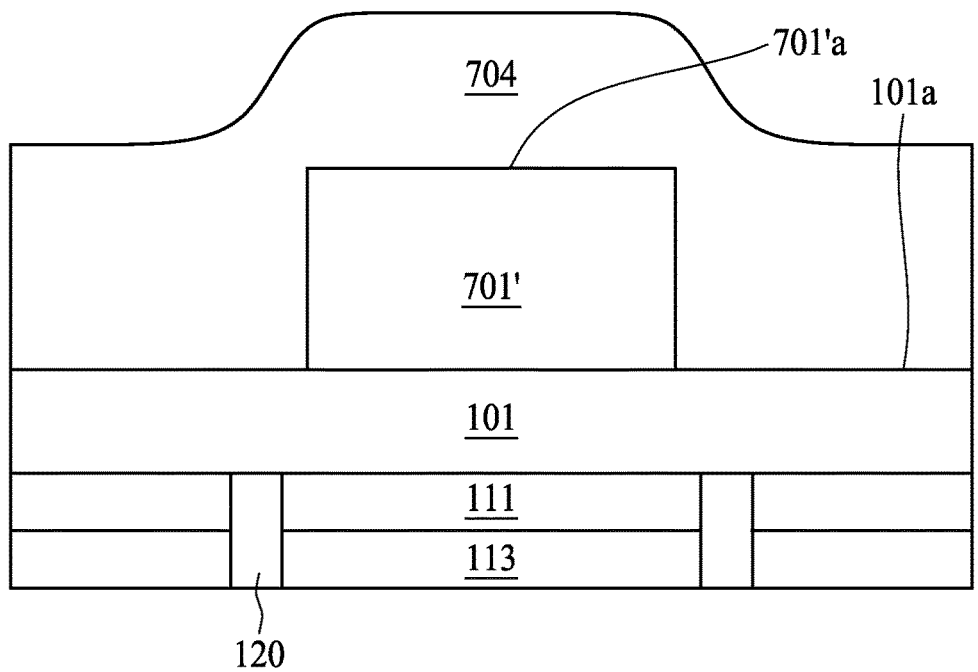
Figure 7C:
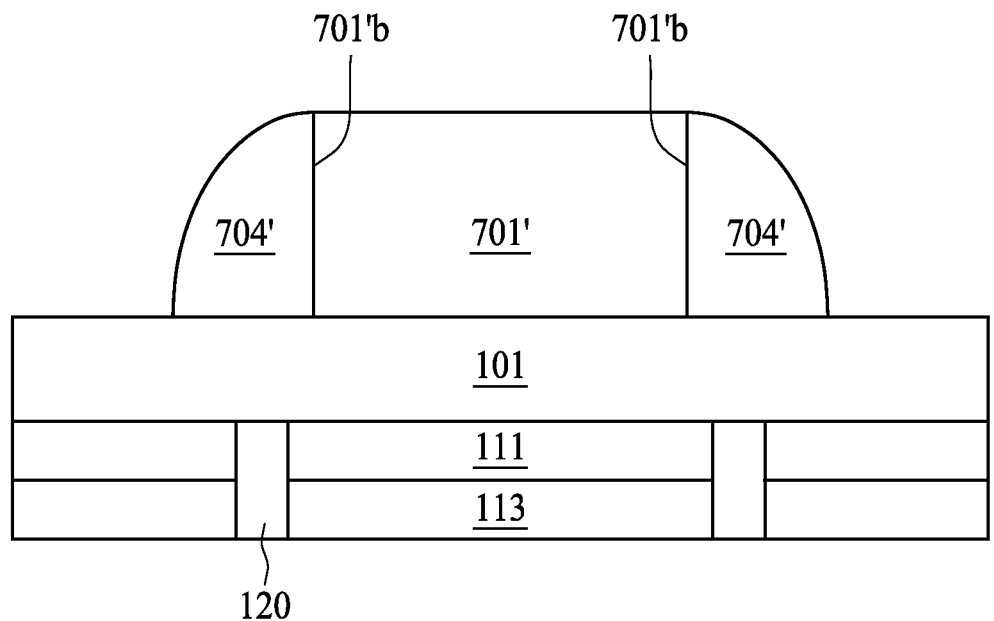

Operation 602 is to form a spacer around the hard mask. Referring to FIG. 7B and FIG. 7C, a first electrode material 704 is deposited over and around the hard mask 701'. In some embodiments, a titanium nitride layer is used as a first electrode material 704 and is blanket deposited over the hard mask 701'. The titanium nitride layer covers a top surface 701'a of the hard mask 701'. In some embodiments, the method depositing the first electrode material 704 includes electro-less plating, sputtering, electro plating, physical vapor deposition (PVD), or atomic layer deposition (ALD). In FIG. 7C, a spacer etch operation is conducted to remove the first electrode material 704 from the top surface 701'a of the hard mask 701' and a top surface 101a of the conductive layer 101. A portion of the first electrode materials 704 remaining at a sidewall 701b of the hard mask 701' is a spacer 704'. The spacer 704' is previously described as a first electrode 103 with reference to FIG. 2 of the present disclosure.

Figure 7D:
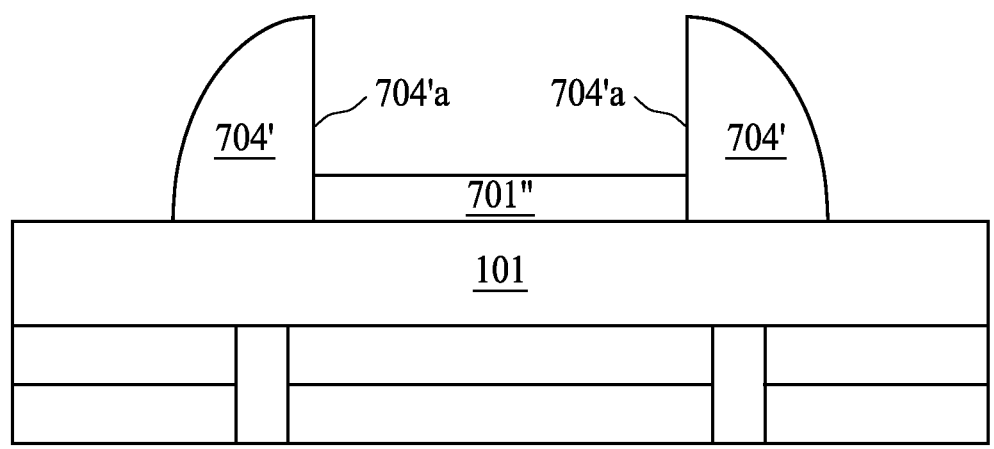

Operation 603 is to remove at least a portion of the hard mask 701' by a wet etch, a dry etch, or a mix operation and obtain a thinned hard mask 701". As shown in FIG. 7D, in some embodiments, the hard mask 701' is silicon oxides and the first electrode materials 704 is titanium nitride. A fluorine chemistry is adopted to remove the silicon oxides. Any etchant or etching method having an etching selectivity between the spacer 704' and the hard mask 701' is suitable to use in operation 603. At least a portion of a sidewall 704'*a* of the spacer 704' is exposed after the operation 603. In some embodiments, the hard mask 701' is partially removed as shown in FIG. 7D. In other embodiments, the hard mask 701' is completely removed, and the entire sidewall 704'*a* of the spacer 704' is exposed.

Figure 7E:
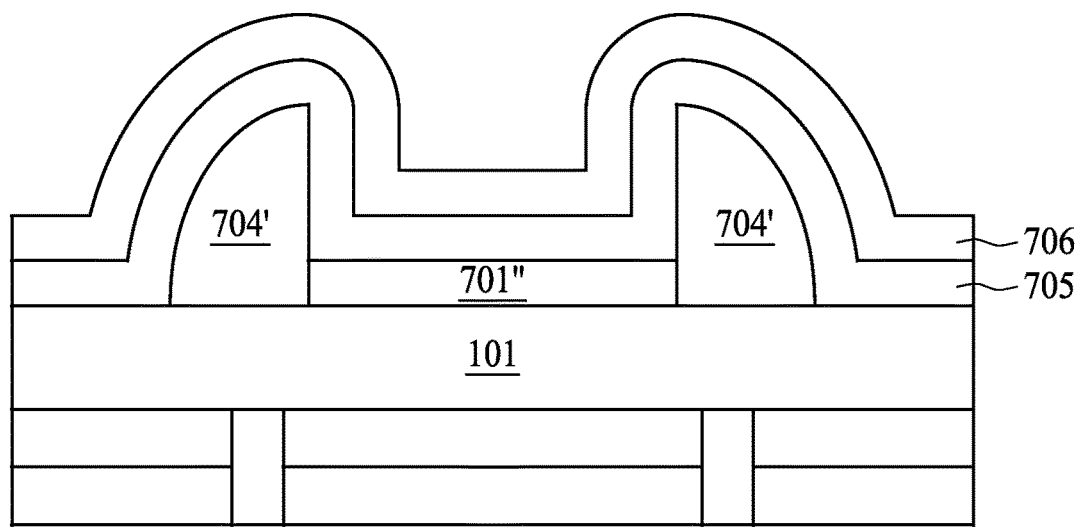
Figure 7F:
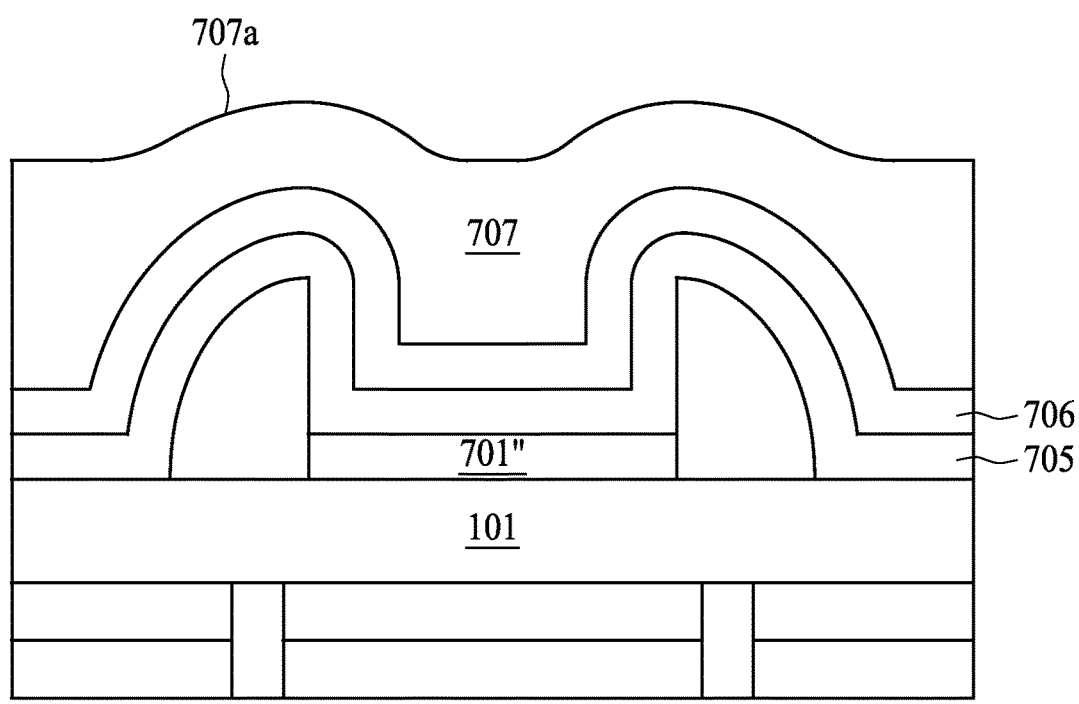

Operation 604 and 605 are to subsequently form a conforming resistance configurable layer and a second conductive layer over the spacer. Referring to FIGS. 7E and 7F, a resistance configurable layer 705 having a thickness less than 150 angstrom is deposited over the spacer 704' and the thinned hard mask 701". The deposited resistance configurable layer 705 conforms to the surface morphology of the underlying structure. In some embodiments, the deposition operation of the resistance configurable layer 705 includes chemical vapor deposition (CVD), ALD, high density plasma CVD (HDPCVD) or pulse laser deposition (PLD).

In FIG. 7F, a second conductive layer 707 including Pt, AlCu, TiN, Au, Ti, Ta, TaN, W, WN, Cu is deposited over the resistance configurable layer 705 by one of the following methods: electro-less plating, sputtering, electro plating, physical vapor deposition (PVD), or ALD. In certain embodiments, an oxygen depriving layer 706 including conductive materials such as Ti, Ta, or Hf is deposited over the resistance configurable layer 705 prior to the deposition of the second conductive layer 707. As shown in FIG. 7E and FIG. 7F, the deposited oxygen depriving layer 706 conforms to the surface morphology of the underlying resistance configurable layer 705. In some embodiments, a planarization operation is carried out to flatten a top surface 707*a* of the second conductive layer 707. The planarization operation includes, but not limited to, a chemical mechanical polishing (CMP) operation.

Figure 7G:
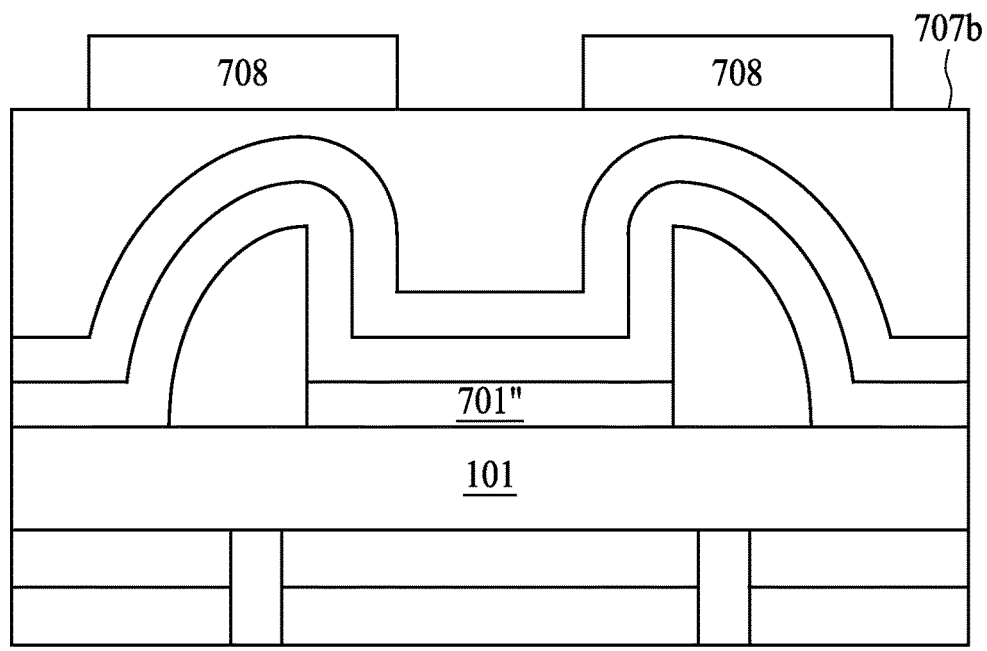
Figure 7H:
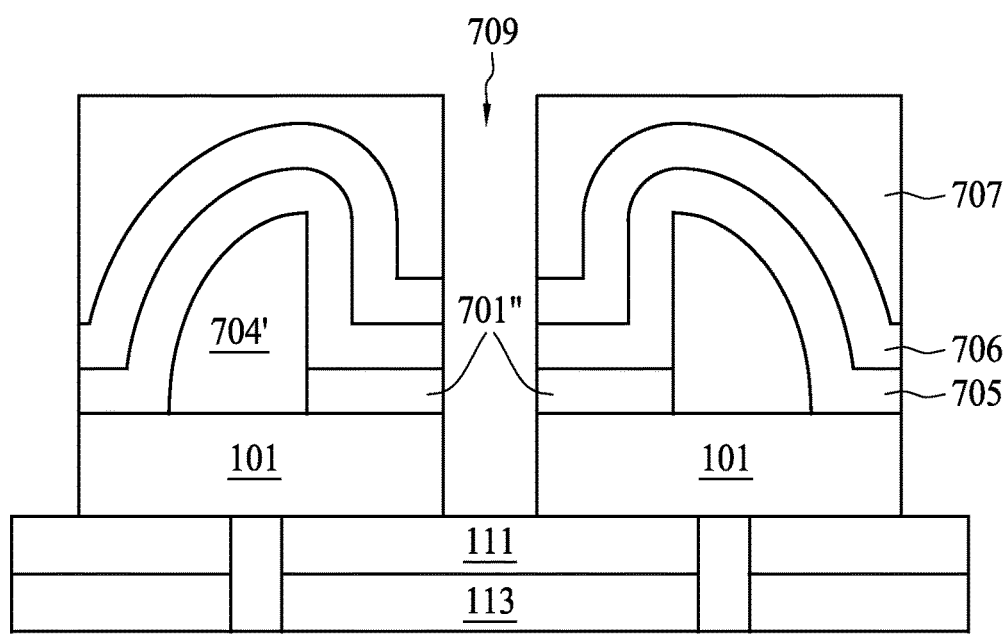

In some embodiments, the method 600 in manufacturing an RRAM further includes an operation separating the spacer 704' through a geometric center thereof into two parts. Referring to FIGS. 7G and 7H, a mask layer 708 is positioned on a planarized surface 707*b* of the second conductive layer 707. In some embodiments, the mask layer 708 is used to protect the underlying spacer 704' and to let a portion of the second conductive layer 707, the oxygen depriving layer 706, the resistance configurable layer 705, the thinned hard mask 701", and the conductive layer 101 be removed. After the removal, a recessed channel 709 having a bottom of dielectric layer 111 is obtained.

Referring to FIG. 7H, the recessed channel 709 passes through a geometric center of the spacer 704'. The geometric center of the spacer 704' is previously discussed with reference to FIGS. 5A and 5B. In certain embodiments, an anisotropic etch such as a reactive ion etch is applied to remove the materials not covered by the mask layer 708.

Some embodiments of the present disclosure provide a semiconductor structure including a conductive layer and a resistance configurable structure over the conductive layer. The resistance configurable structure comprising a first electrode, a resistance configurable layer, and a second electrode. The first electrode has a first sidewall, a second sidewall, and a bottom surface on the conductive layer. A joint between the first sidewall and the second sidewall includes an electric field enhancement structure. The resistance configurable layer is over the first electrode and the electric field enhancement structure. The second electrode is over the resistance configurable layer.

In some embodiments, the electric field enhancement structure of a semiconductor structure includes an angle about or less than 90 degrees.

In some embodiments, the resistance configurable structure further includes a dielectric layer on the conductive layer, contacting at least a portion of the first sidewall. In certain embodiments, a height of the dielectric layer to a height of the first sidewall is in a range of from about 0.2 to about 1.0.

In some embodiments, the second electrode of the electric field enhancement structure includes an oxygen depriving layer contacting the resistance configurable layer, and the oxygen depriving layer is configured to deprive oxygen from the resistance configurable layer. In certain embodiments, the oxygen depriving layer includes conductive materials such as Ti, Ta, Hf, Zr, or the like.

In some embodiments, a width of the bottom surface of the first electrode is about or less than 20 nm. In certain embodiments, the first electrode is a conductive sidewall spacer. In certain embodiments, the first electrode includes at least one selected from the group consisting essentially of Pt, AlCu, TiN, Au, Ti, Ta, TaN, W, WN, and Cu.

In some embodiments, a thickness of the resistance configurable layer is thin enough to reduce the forming voltage and thick enough to prevent permanent dielectric break down from happening. In certain embodiments, a thickness of the resistance configurable layer is about or less than 150 angstrom. In certain embodiments, the resistance configurable layer comprises at least one selected from the group consisting essentially of high-k dielectric material, a binary metal oxide, a transition metal oxide, and a lanthanide metal oxide.

Some embodiments of the present disclosure provide a resistive random access memory (RRAM). The RRAM includes a first dielectric layer having a top surface, a metal-insulator-metal (MIM) structure on the first dielectric layer. The MIM structure includes a first electrode, a resistance configurable layer, and a second electrode. The first electrode is positioned on the top surface of the first dielectric layer. The first electrode has an electric field enhancement structure with a first sidewall perpendicular to the top surface of the dielectric layer and a second sidewall including an arc. The resistance configurable layer is disposed over the electric filed enhancement structure. The second electrode is over the resistance configurable layer.

In some embodiments, the arc includes a first end and a second end. The first end is connecting to a planar portion of the first electrode, and the second end is connecting to the first sidewall.

In some embodiments, the electric field enhancement structure of the first electrode is a sidewall spacer.

In some embodiments, the MIM structure further comprising a second dielectric layer on the first electrode, contacting at least a portion of the first sidewall. In certain embodiments, the second dielectric layer is less etching resistant than the first dielectric layer. In certain embodiments, the second dielectric layer is silicon dioxide.

In some embodiments, the second electrode of the MIM structure includes an oxygen depriving layer contacting the resistance configurable layer. The oxygen depriving layer is configured to deprive oxygen atoms from the resistance configurable layer. In certain embodiments, the oxygen depriving layer includes conductive materials such as Ti, Ta, Zr, Hf, or the like.

In some embodiments, the resistance configurable layer is compliant with a contour of the electric field enhancement structure. In certain embodiments, the resistance configurable layer conforms to the surface morphology of the first electrode.

In some embodiments, the oxygen depriving layer is compliant with a contour of the resistance configurable layer. In certain embodiments, the oxygen depriving layer conforms to the surface morphology of the first electrode. In certain embodiments, the oxygen depriving layer conforms to the surface morphology of the electric field enhancement structure.

Some embodiments of the present disclosure provide a method for manufacturing an RRAM. The method includes patterning a hard mask on a first conductive layer; forming a spacer around the hard mask, the spacer comprising a vertical sidewall contacting the hard mask; removing at least a portion of the hard mask to expose at least a portion of the vertical sidewall of the spacer; forming a conforming resistance configurable layer over the spacer; and forming a second conductive layer over the conforming resistance configurable layer.

In some embodiments, the method for manufacturing an RRAM further includes an operation of separating the first conductive layer, the hard mask, the resistance configurable layer, and the second conductive layer through a geometric center of the spacer.

In some embodiments, the formation of the second conductive layer comprises a chemical mechanical polishing (CMP) operation. The CMP operation is to planarize a top surface of the second conductive layer for the subsequent operation applied on the RRAM.

In some embodiments, the method for manufacturing an RRAM further includes formation of a conforming oxygen depriving layer on the resistance configurable layer. In certain embodiments, the oxygen depriving layer is compliant with the surface morphology of the resistance configurable layer. In certain embodiments, the oxygen depriving layer is compliant with the surface morphology of the first electrode.

Although the present invention and its advantages have been described in detail, it should be understood that various changes, substitutions and alterations cancan be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
   a conductive layer;
   a resistance configurable structure over the conductive layer, the resistance configurable structure comprising:
   a first electrode comprising a first sidewall, a second sidewall, and a bottom surface on the conductive layer, wherein the first sidewall and the second sidewall form an electric field enhancement structure;
   a resistance configurable layer over the first electrode; the resistance configurable layer having a first portion and a second portion, wherein the first portion is in direct contact with the conductive layer, and the second portion comprising a dielectric layer between the resistance configurable layer and the conductive layer; and
   a second electrode over the resistance configurable layer.

2. The semiconductor in claim 1, wherein the electric field enhancement structure comprises an angle about or less than 90 degrees.

3. The semiconductor in claim 1, wherein a ratio of a thickness of the dielectric layer with respect to a height of the first sidewall is in a range of from about 0.2 to about 1.0.

4. The semiconductor in claim 1, wherein the second electrode comprises an oxygen depriving layer contacting the resistance configurable layer, the oxygen depriving layer configured to deprive oxygen from the resistance configurable layer.

5. The semiconductor in claim 1, wherein the bottom surface of the first electrode comprises a width about or less than 20 nm.

6. The semiconductor in claim 1, wherein the resistance configurable layer comprises a thickness about or less than 150 angstrom.

7. The semiconductor in claim 1, wherein each of the first electrode and the second electrode comprises at least one selected from the group consisting essentially of Pt, AlCu, TiN, Au, Ti, Ta, TaN, W, WN, and Cu.

8. The semiconductor in claim 1, wherein the resistance configurable layer comprises at least one selected from the group consisting essentially of high-k dielectric material, a binary metal oxide, a transition metal oxide, and a lanthanide metal oxide.

9. A resistive random access memory (RRAM), comprising:
   a first dielectric layer comprising a top surface;
   a metal-insulator-metal (MIM) structure positioned on the first dielectric layer, the MIM structure comprising:
   a first electrode on the top surface of the first dielectric layer, the first electrode comprising an electric field enhancement structure with a first sidewall perpendicular to the top surface of the dielectric layer and a second sidewall comprising an arc;
   a resistance configurable layer over the electric field enhancement structure, being in physical contact with the first sidewall and the second sidewall; and
   a second electrode over the resistance configurable layer.

10. The RRAM in claim 9, one end of the arc connecting to the first sidewall.

11. The RRAM in claim 9, wherein the first electrode comprises a spacer.

12. The RRAM in claim 9, further comprising a second dielectric layer on the first electrode, contacting at least a portion of the first sidewall.

13. The RRAM in claim 9, wherein the second electrode comprises an oxygen depriving layer contacting the resistance configurable layer, the oxygen depriving layer configured to deprive oxygen from the resistance configurable layer.

14. The RRAM in claim 9, the resistance configurable layer conforming a contour of the electric field enhancement structure.

15. The RRAM in claim 13, the oxygen depriving layer conforming a contour of the resistance configurable layer.

16. A resistive random access memory (RRAM), comprising:
- a conductive structure;
- a metal-insulator-metal (MIM) structure positioned on the conductive structure, the MIM structure comprising:
  - an electrode comprising a planar portion and an electric field enhancement structure, the electric field enhancement structure comprising a first sidewall perpendicular to a top surface of the planar portion and a second sidewall being an arc;
  - a resistance configurable layer over the electrode and being in physical contact with the first sidewall and the second sidewall.

17. The RRAM in claim 9, wherein the resistance configurable layer of the MIM structure comprises high-k dielectric, binary metal oxides, transition metal oxides, or lanthanide series metal oxides.

18. The RRAM in claim 9, further comprising an oxygen depriving layer between the second electrode and the resistance configurable layer, the oxygen depriving layer including Ti, Ta, Hf, or the combination thereof.

19. The RRAM in claim 16, wherein the resistance configurable layer comprises a bend over a joint connecting the second sidewall and the planar portion of the first electrode.

20. The semiconductor in claim 1, wherein the dielectric layer comprises silicon dioxide.

* * * * *